(12) United States Patent
Bhalla et al.

(10) Patent No.: US 7,923,774 B2
(45) Date of Patent: Apr. 12, 2011

(54) POWER MOS DEVICE WITH CONDUCTIVE CONTACT LAYER

(75) Inventors: Anup Bhalla, Santa Clara, CA (US); Sik Lui, Sunnyvale, CA (US); Tiesheng Li, San Jose, CA (US)

(73) Assignee: Alpha & Omega Semiconductor Limited (BM)

( * ) Notice: Subject to any disclaimer, the term of this patent is extended or adjusted under 35 U.S.C. 154(b) by 0 days.

(21) Appl. No.: 12/384,172

(22) Filed: Mar. 31, 2009

(65) Prior Publication Data

US 2009/0224316 A1 Sep. 10, 2009

Related U.S. Application Data

(63) Continuation of application No. 11/900,616, filed on Sep. 11, 2007, now Pat. No. 7,605,425, which is a continuation of application No. 11/056,346, filed on Feb. 11, 2005, now Pat. No. 7,285,822.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/330; 257/332; 257/334

(58) Field of Classification Search .................. 257/330, 257/332, 334
See application file for complete search history.

(56) References Cited

U.S. PATENT DOCUMENTS

| 4,156,246 A | 5/1979 | Pedersen |
| 4,521,795 A | 6/1985 | Coe et al. |
| 4,823,172 A | 4/1989 | Mihara |
| 4,967,243 A | 10/1990 | Baliga et al. |
| 4,967,245 A | 10/1990 | Cogan et al. |
| 5,111,253 A | 5/1992 | Korman et al. |
| 5,164,325 A | 11/1992 | Cogan et al. |
| 5,366,914 A | 11/1994 | Takahashi et al. |
| 5,378,655 A | 1/1995 | Hutchings et al. |
| 5,489,787 A | 2/1996 | Amaratunga et al. |
| 5,489,797 A | 2/1996 | Chan et al. |

(Continued)

FOREIGN PATENT DOCUMENTS

JP 09-102602 4/1997

OTHER PUBLICATIONS

Shannon, J.M., "Control of Schottky barrier height using highly doped surface layers", Solid-State Electronics vol. 19, No. 6, p. 537-543, Jun. 1976.

*Primary Examiner* — Thien F Tran
(74) *Attorney, Agent, or Firm* — Van Pelt, Yi & James LLP

(57) ABSTRACT

A semiconductor device includes a drain, a body disposed over the drain, a source embedded in the body, a gate trench extending through the source and the body into the drain, a gate disposed in the gate trench, a source body contact trench extending through the source into the body, a conductive contact layer disposed along at least a portion of a source body contact trench sidewall and in contact with at least a portion of the source, and a trench filling material disposed in the source body contact trench and overlaying at least a portion of the conductive contact layer.

12 Claims, 12 Drawing Sheets

U.S. PATENT DOCUMENTS

| | | | |
|---|---|---|---|
| 5,576,245 A | 11/1996 | Cogan et al. |
| 5,614,749 A | 3/1997 | Ueno |
| 5,623,152 A | 4/1997 | Majumdar et al. |
| 5,693,569 A | 12/1997 | Ueno |
| 5,886,383 A | 3/1999 | Kizner |
| 6,037,628 A | 3/2000 | Huang |
| 6,110,799 A | 8/2000 | Huang |
| 6,188,105 B1 | 2/2001 | Kocon et al. |
| 6,251,730 B1 | 6/2001 | Luo |
| 6,351,018 B1 | 2/2002 | Sapp |
| 6,359,306 B1 | 3/2002 | Ninomiya |
| 6,433,396 B1 | 8/2002 | Kinzer |
| 6,498,071 B2 | 12/2002 | Hijzen et al. |
| 6,608,350 B2 | 8/2003 | Kinzer et al. |
| 6,621,107 B2 | 9/2003 | Blanchard et al. |
| 6,638,826 B2 | 10/2003 | Zeng et al. |
| 6,686,614 B2 | 2/2004 | Tihanyi |
| 6,707,127 B1 | 3/2004 | Hshieh et al. |
| 6,710,403 B2 | 3/2004 | Sapp |
| 6,737,704 B1 | 5/2004 | Takemori et al. |
| 6,774,408 B2 | 8/2004 | Ninomiya |
| 6,784,505 B2 | 8/2004 | Zeng |
| 6,818,946 B1 | 11/2004 | Venkatraman |
| 6,841,836 B2 | 1/2005 | Saggio et al. |
| 6,872,611 B2 | 3/2005 | Takemori et al. |
| 6,987,305 B2 | 1/2006 | He et al. |
| 6,998,678 B2 | 2/2006 | Werner et al. |
| 7,005,347 B1 | 2/2006 | Bhalla et al. |
| 7,285,822 B2 | 10/2007 | Bhalla et al. |
| 7,446,374 B2 | 11/2008 | Thorup et al. |
| 2001/0009800 A1 | 7/2001 | Hijzen et al. |
| 2003/0020134 A1 | 1/2003 | Werner et al. |
| 2004/0012050 A1 | 1/2004 | Uno et al. |
| 2004/0222457 A1 | 11/2004 | Kim et al. |
| 2005/0029584 A1 | 2/2005 | Shiraishi et al. |
| 2005/0167742 A1 | 8/2005 | Challa et al. |
| 2006/0071268 A1 | 4/2006 | Tai et al. |
| 2006/0202264 A1 | 9/2006 | Bhalla et al. |
| 2006/0209887 A1 | 9/2006 | Bhalla et al. |
| 2006/0214221 A1 | 9/2006 | Challa et al. |
| 2007/0075392 A1 | 4/2007 | Pan et al. |
| 2008/0246082 A1 | 10/2008 | Hshieh |
| 2009/0039456 A1 | 2/2009 | Bhalla et al. |
| 2009/0212358 A1* | 8/2009 | Shiraishi et al. ............ 257/330 |

* cited by examiner

POWER MOS DEVICE WITH CONDUCTIVE CONTACT LAYER

CROSS REFERENCE TO OTHER APPLICATIONS

This application is a continuation of U.S. patent application Ser. No. 11/900,616 entitled POWER MOS DEVICE, filed Sep. 11, 2007 now U.S. Pat. No. 7,605,425 which is incorporated herein by reference for all purposes, which is a continuation of U.S. patent application Ser. No. 11/056,346, now U.S. Pat. No. 7,285,822, entitled POWER MOS DEVICE, filed Feb. 11, 2005 which is incorporated herein by reference for all purposes.

BACKGROUND OF THE INVENTION

Power MOS devices are commonly used in electronic circuits. Depending on the application, different device characteristics may be desirable. One common application is a DC-DC converter, which includes a power MOS device as a synchronous rectifier (also referred to as the low side FET) and another power MOS device as a control switch (also referred to as the high side FET). The low side FET typically requires a small on-resistance to achieve good power switch efficiency. The high side FET typically requires a small gate capacitance for fast switching and good performance.

The value of a transistor's on-resistance ($R_{dson}$) is typically proportional to the channel length (L) and inversely proportional to the number of active cells per unit area (W). To reduce the value of $R_{dson}$, the channel length can be reduced by using shallower source and body, and the number of cells per unit area can be increased by reducing the cell size. However, the channel length L is typically limited because of the punch-through phenomenon. The number of cells per unit area is limited by manufacturing technology and by the need to make a good contact to both the source and body regions of the cell. As the channel length and the cell density increase, the gate capacitance increases. Lower device capacitance is preferred for reduced switching losses. In some applications such as synchronous rectification, the stored charge and forward drop of the body diode also result in efficiency loss. These factors together tend to limit the performance of DMOS power devices.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

An improved DMOS device and an associated fabrication process are disclosed. The device includes a drain, a body and a source. The gate of the device is disposed in a gate trench that extends through the source and the body into the drain. In proximity of the gate trench and adjacent to the source, there is a source body contact trench with an anti-punch through implant disposed along the trench wall. The top surface of the gate extends substantially above the top surface of the body, thus insuring gate-source overlap and allowing source region to be shallow. The process for fabricating the device includes forming a hard mask on a substrate, forming a gate trench in the substrate through the hard mask, depositing gate material in the gate trench, removing the hard mask to leave a gate trench, forming a source body contact trench having a trench wall, and forming an anti-punch through implant.

Figure 1:
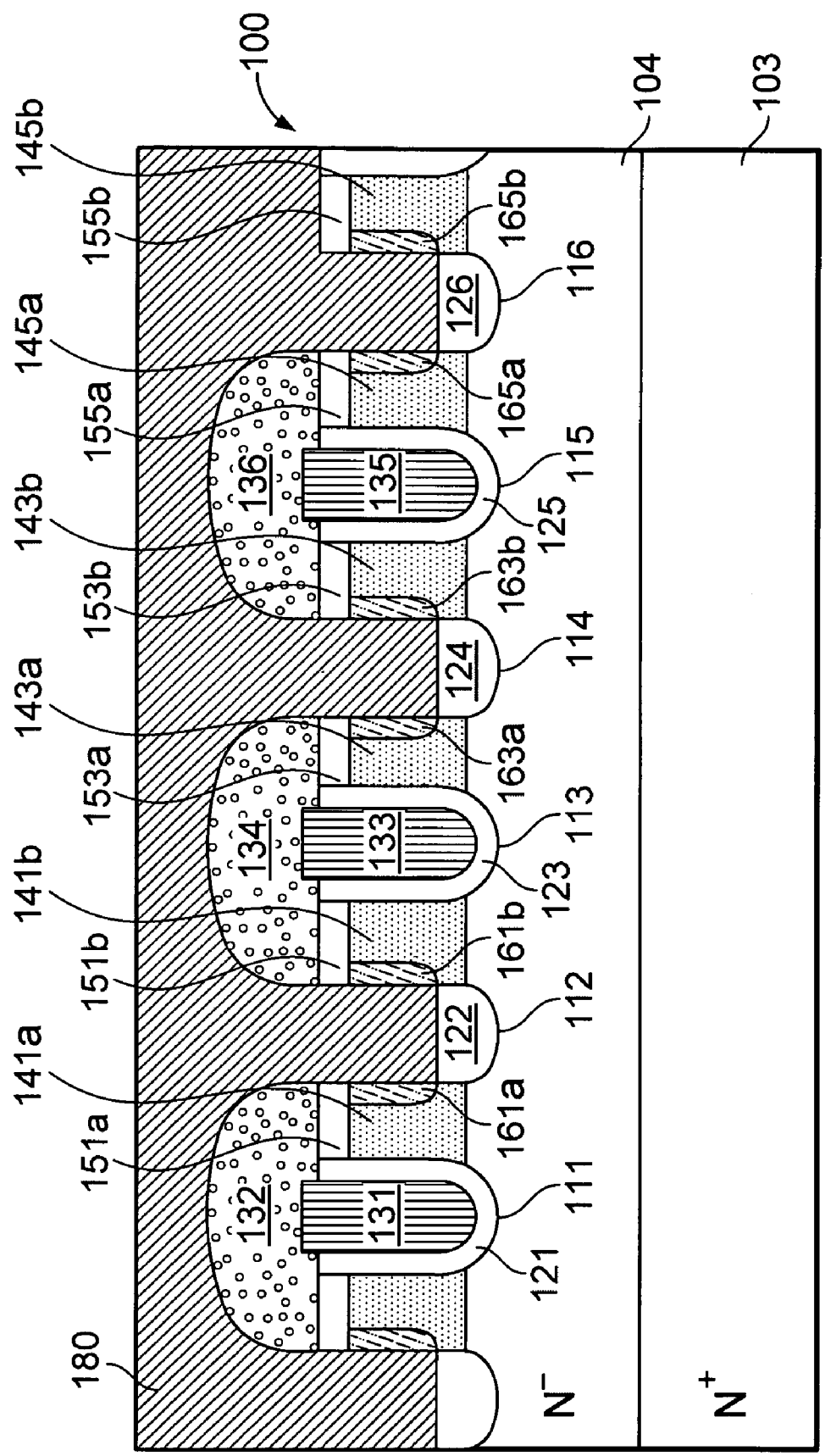
FIG. 1 is a cross sectional view of a double-diffused metal oxide semiconductor (DMOS) device embodiment.

For the purpose of example, N-channel devices with source and drain made of N-type material and body made of P-type material are discussed in detail throughout this specification. The techniques and structures disclosed herein are also applicable to P-channel devices. FIG. 1 is a cross sectional view of a double-diffused metal oxide semiconductor (DMOS) device embodiment. In this example, device 100 includes a drain that is formed on a $N^+$-type semiconductor substrate 103, extending into an epitaxial (epi) layer 104 of $N^-$-type semiconductor that is formed on substrate 103. Gate trenches such as 111, 113, and 115 are etched in epi layer 104, and gate oxide layers such as 121, 123 and 125 are formed inside the gate trenches. Gates 131, 133 and 135 are disposed inside gate trenches 111, 113 and 115, respectively, and are insulated from the epi layer by the oxide layers. The gates are made of a conductive material such as polycrystalline silicon (poly) and the oxide layers are made of an insulating material such as thermal oxide.

Source regions 151, 153 and 155 are embedded in body regions 141, 143 and 145, respectively. The source regions extend downward from the top surface of the body into the body itself. In the embodiment shown, gate 131 has a gate top surface that extends substantially above the top surface of the body where the source is embedded. Such a configuration guarantees the overlap of the gate and the source, allowing the source region to be shallower than a source region in a device with a recessed gate, and increases device efficiency and performance. The amount by which the gate poly top surface extends above the source-body junction may vary for different embodiments. The structure is also applicable to devices with gates that do not extend above the top surface of the body.

A set of source body contact trenches 112, 114 and 116 are formed between the gates. For example, contact trench 112 penetrates through source region 151 forming regions 151a and 151b adjacent to the gate and through body region 141 forming regions 141a and 141b adjacent to the trench. During operation, the drain and body regions together act as a diode, referred to as the body diode. A dielectric material layer is disposed over the gate to insulate the gate from source-body contact. Appropriate dielectric material includes thermal oxide, low temperature oxide (LTO), boro-phospho-silicate glass (BPSG), etc. The dielectric material forms insulating regions such as 132, 134 and 136 on top of the gates as well as on top of the body and source regions.

In the example shown, the FET channel is formed along the gate trench sidewall between the source and body junctions. In a device with a short channel region, as the voltage between the source and the drain increases, the depletion region expands and may eventually reach the source junction. This phenomenon, referred to as punch through, limits the extent to which the channel may be shortened. To prevent punch through, regions such as 161a, 161b, 163a, 163b, 165a and 165b along the walls of the source body contact trench are heavily doped with P type material to form $P^+$-type regions. The $P^+$-type regions prevent the depletion region from encroaching upon the source region. Thus, these implants are sometimes referred to as anti-punch through implants. In some embodiments, to achieve pronounced anti-punch through effects, the $P^+$ regions are disposed as close as possible to the channel region and/or as close as it is allowed by manufacturing alignment capability and $P^+$ sidewall dopant penetration control. In some embodiments, the misalignment between the trench contact and the gate trench is minimized by self-aligning the contact, and the trench contact is placed as closely centered between gate trenches as possible. With these structural enhancements, it is possible to shorten the channel such that the net charge in the channel per unit area is well below the minimum charge needed to prevent punch through in an ideal unprotected structure. The anti-punch through implants makes it possible to construct very shallow trench short-channel devices, thus improving on-resistance $R_{dson}$ and reducing the gate capacitance. The anti-punch through implants also improve body contact resistance.

A layer of metal suitable for making Schottky contact with the lightly doped drain (such as titanium (Ti), platinum (Pt), palladium (Pd), tungsten (W) or any other appropriate material) is deposited on the bottom of source body contact trenches 112, 114 and 116, to form contact electrodes 122, 124 and 126, respectively. Since the punch-through implants are disposed along the walls of the trenches but not along the bottoms of the trenches, the contact electrodes are in contact with $N^-$ drain region 104. Together, the contact electrodes and the drain region form Schottky diodes that are in parallel with the body diode. The Schottky diodes reduce the body diode forward drop and minimize the stored charge, making the MOSFET more efficient. A layer of metal 180 is deposited over the Schottky metal to form source body contact. In some embodiments, metal layer 180 is made of aluminum (Al) or made of a Ti/TiN/Al stack.

In some embodiments, a single metal that is capable of simultaneously forming a Schottky contact to the $N^-$ drain and forming good ohmic contact to the $P^+$ body and $N^+$ source (e.g. platinum) is used. Thus, the Schottky metal is not necessarily placed in the form of a plug on the bottom of the source-body contact trench. On the other hand, placing the bottom Schottky metal in the form of a plug on the bottom of the source-body trench can be useful for blocking the anti-punch through implant from getting into the $N^-$ drain region.

Figure 2:
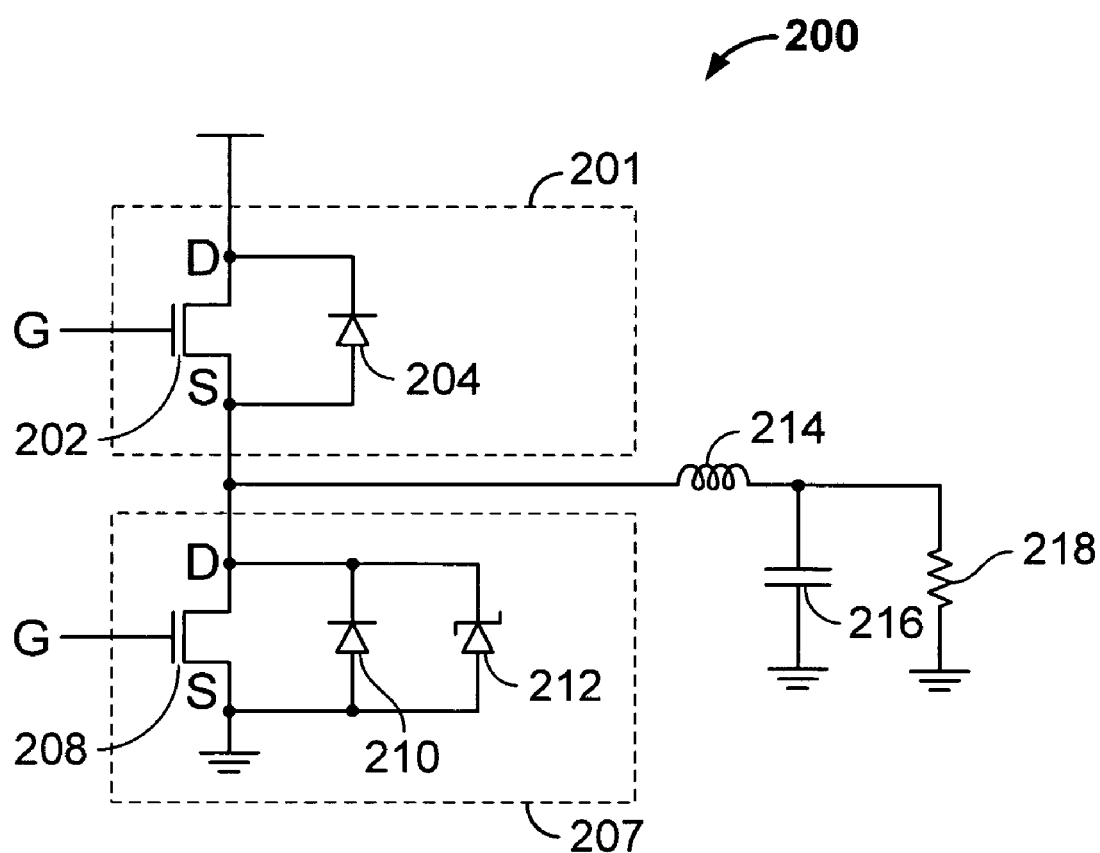
FIG. 2 is a diagram illustrating a buck converter circuit example.

FIG. 2 is a diagram illustrating a buck converter circuit example. In this example, circuit 200 is shown to employ a high side FET device 201 and a low side FET device 207. High side device 201 includes a transistor 202 and a body diode 204. Low side device 207 is with structures similar to the one shown in FIG. 1, includes a transistor 208, a body diode 210 and a Schottky diode 212. The load includes an inductor 214, a capacitor 216 and a resistor 218. During normal operation, device 201 is turned on to transfer power from the input source to the load. This causes the current to ramp up in the inductor. When device 201 is turned off, the inductor current still flows and commutates to body diode 210 of device 207. After a short delay, the control circuit turns on device 207, which turns on the channel of transistor 208 and dramatically reduces the forward drop across the drain-source terminals of device 208. Without Schottky diode 212, the body diode conduction loss and the losses from removing the stored charge in body diode 210 of device 207 can be substantial. However, if Schottky diode 212 is built into device 207 and if the Schottky diode has a low forward drop, the conduction loss is greatly reduced. Since the low forward drop across the Schottky diode is lower than the junction drop of the body diode, no stored charge is injected while the Schottky diode conducts, further improving the losses related to diode recovery.

Figure 3A:
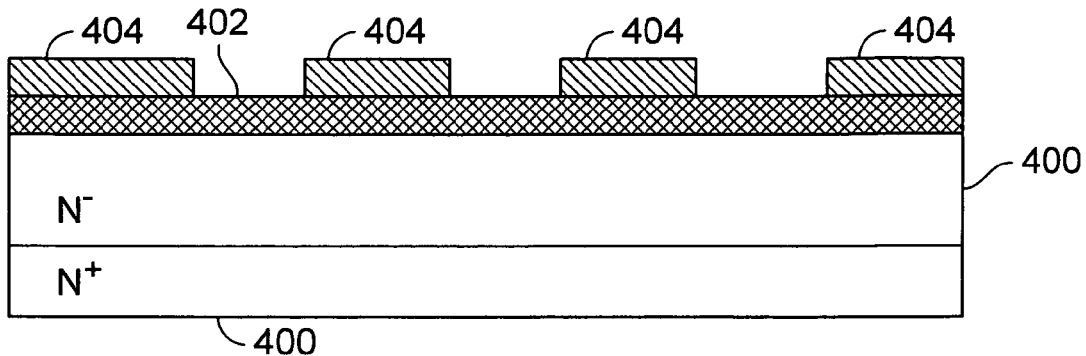
FIGS. 3A-3P are device cross-sectional views illustrating an example fabrication process used for fabricating device 100 of FIG. 1.
Figure 3B:
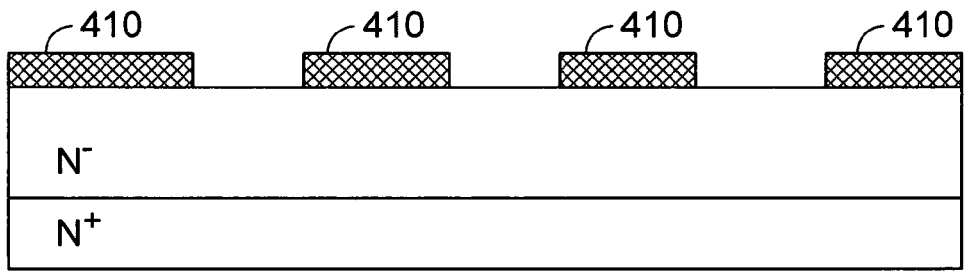
Figure 3C:
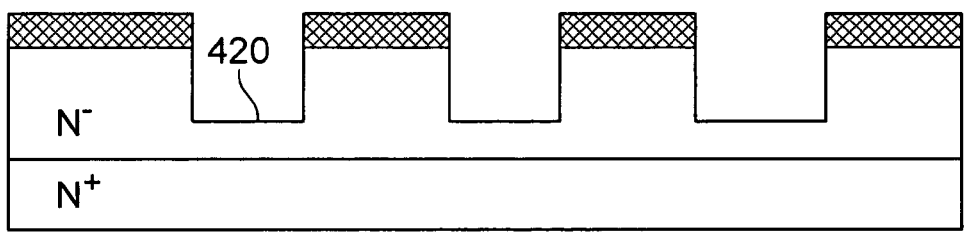
Figure 3D:
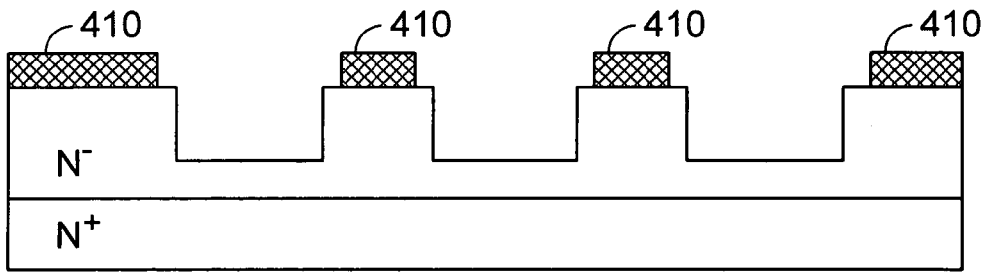
Figure 3E:
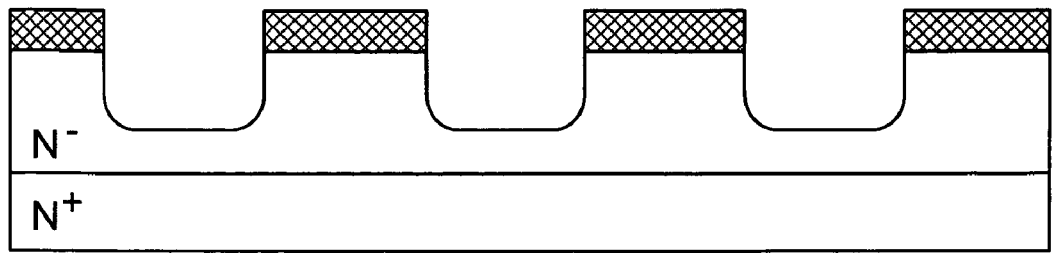
Figure 3F:
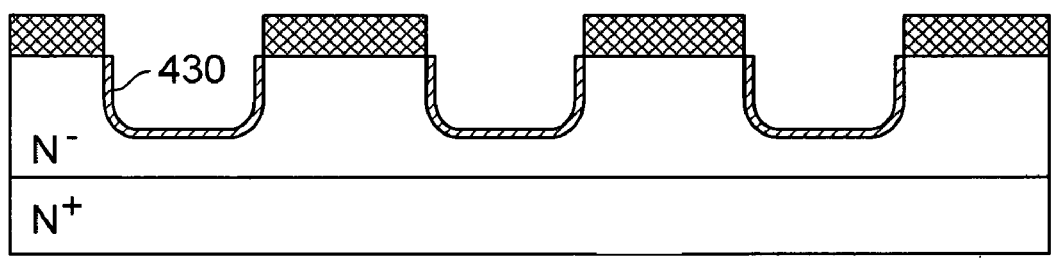
Figure 3G:
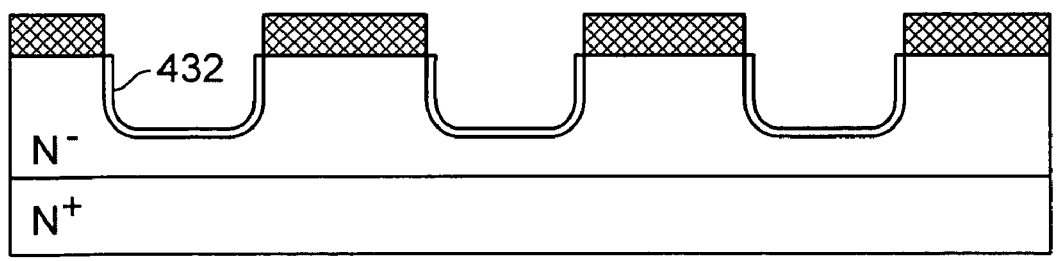
Figure 3H:
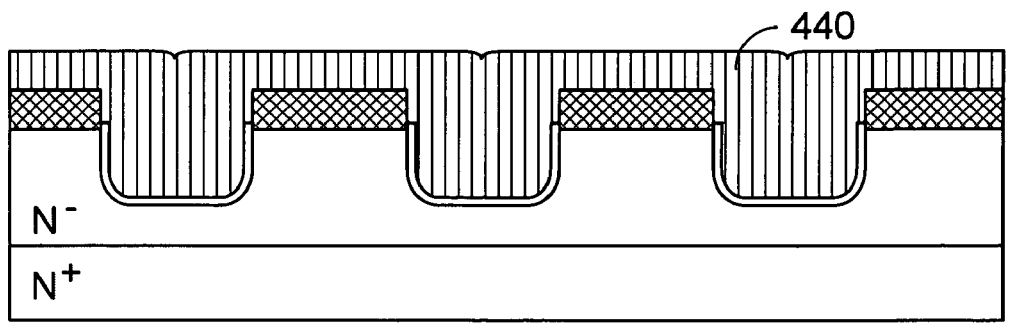
Figure 3I:
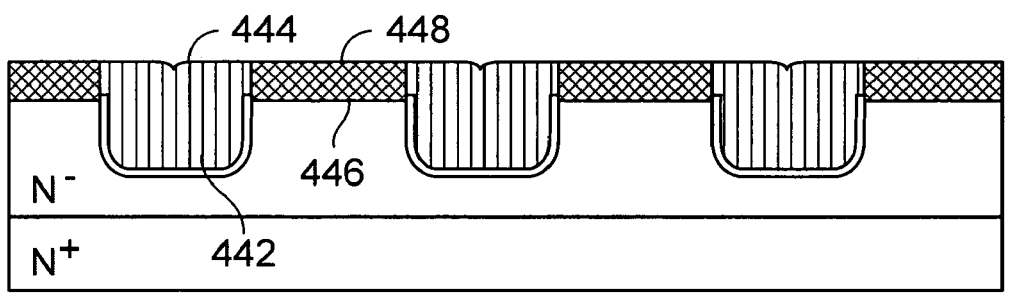
Figure 3J:
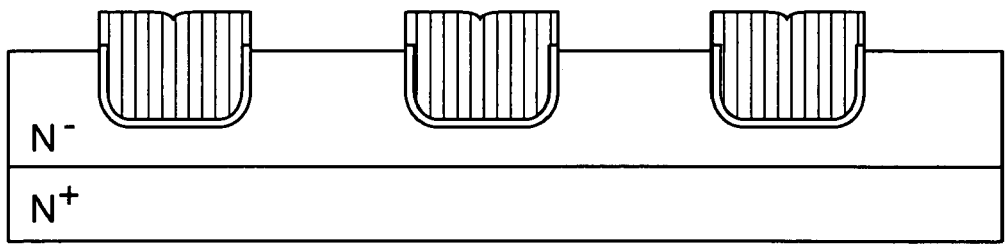
Figure 3K:
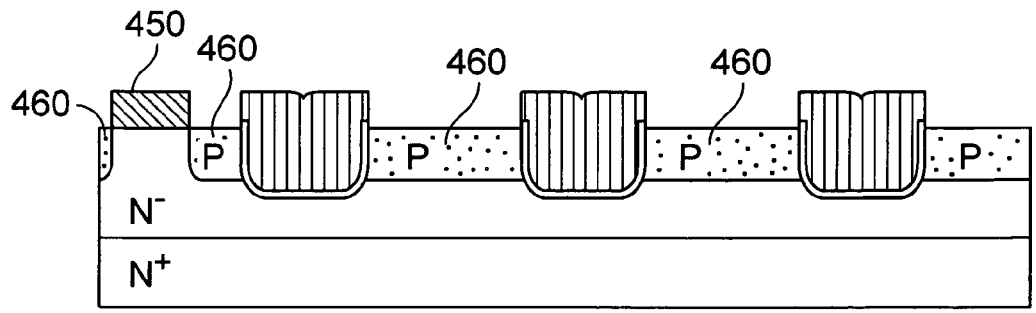
Figure 3L:
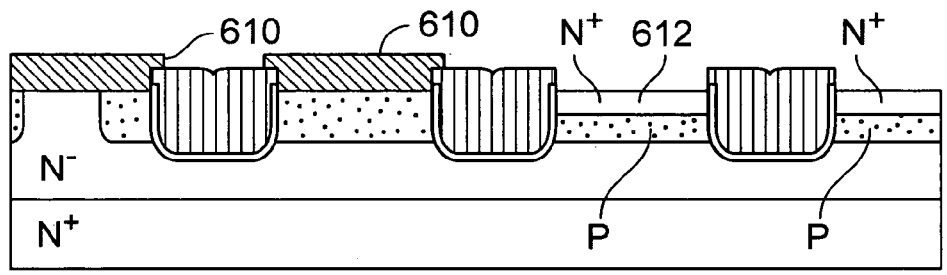
Figure 3M:
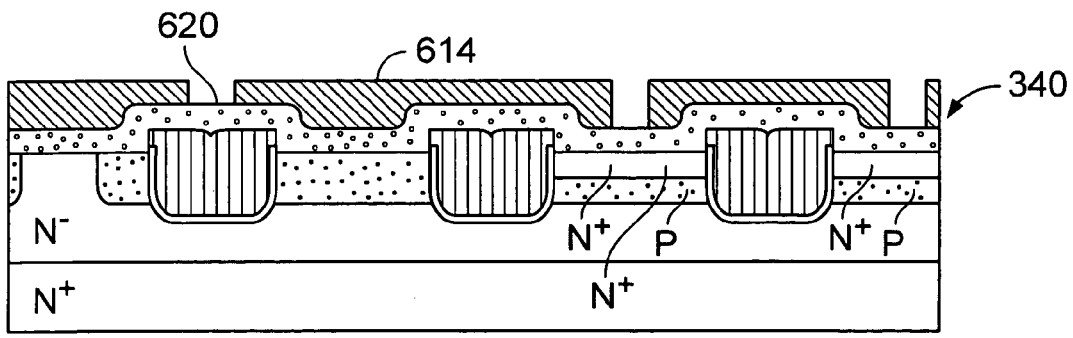
Figure 3N:
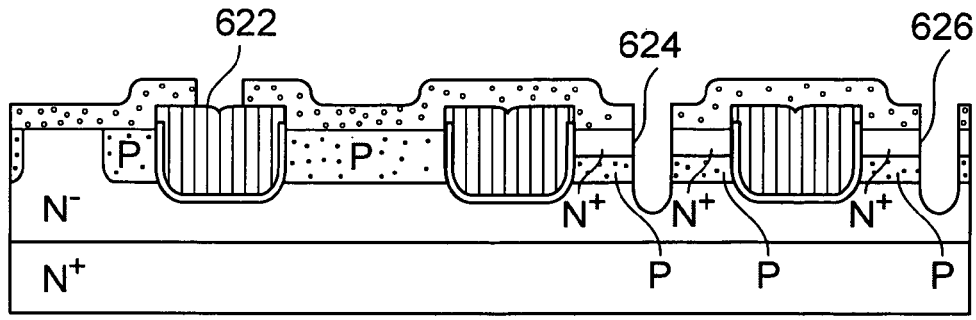
Figure 3O:
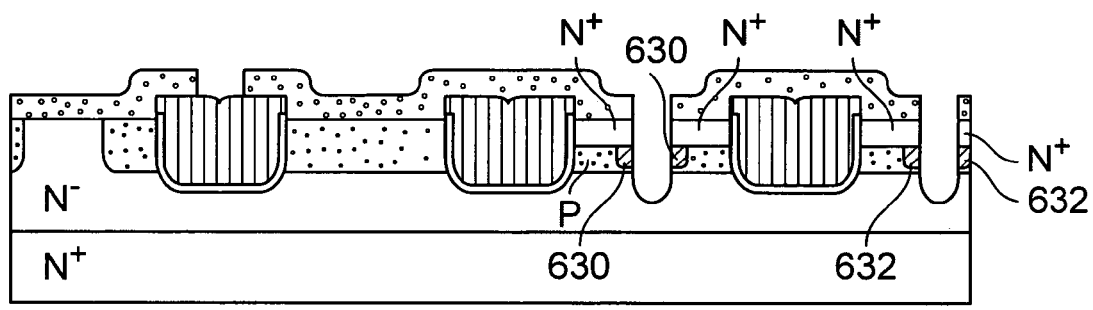
Figure 3P:
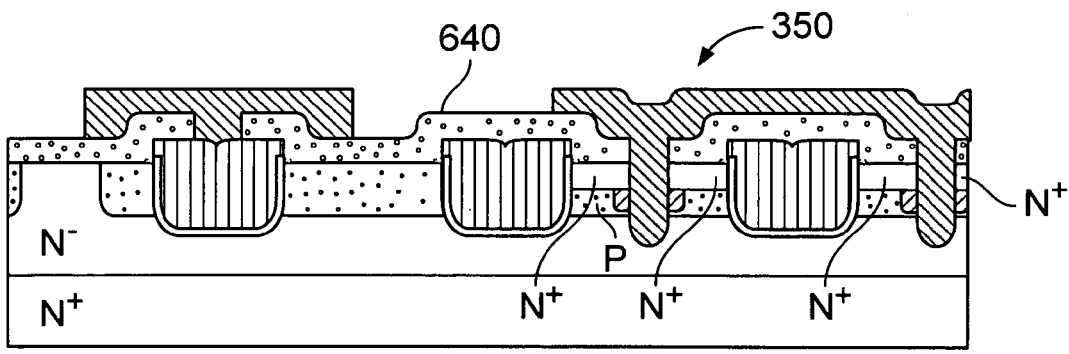

FIGS. 3A-3P are device cross-sectional views illustrating an example fabrication process used for fabricating device 100 of FIG. 1. In this example, an N type substrate (i.e., an $N^+$ silicon wafer with an $N^-$ epi layer grown on it) is used as the drain of the device. In FIG. 3A, a $SiO_2$ layer 402 is formed on N type substrate 400 by deposition or thermal oxidation. The thickness of the silicon oxide ranges from 500 Å to 30000 Å in some embodiments. Other thicknesses are used in other embodiments. The thickness is adjusted depending on the desired height of the gate. A photoresist layer 404 is spun on top of the oxide layer and patterned using a trench mask.

In FIG. 3B, the $SiO_2$ in the exposed areas is removed, leaving a $SiO_2$ hard mask 410 for silicon etching. In FIG. 3C, the silicon is etched anisotropically, leaving trenches such as 420. The gate material is deposited in the trenches. The gate that is later formed within the trench has sides that are substantially perpendicular to the top surface of the substrate. In FIG. 3D, $SiO_2$ hard mask 410 is etched back by an appropriate amount so that the trench walls remain approximately aligned with the edge of the hard mask after later etching steps. $SiO_2$ is the mask material used in this embodiment because etching using a $SiO_2$ hard mask leaves relatively straight trench walls that mutually align with the sides of the mask. Other material may be used as appropriate. Certain other types of material traditionally used for hard mask etching, such as $Si_3N_4$, may leave the etched trench walls with a curvature that is less desirable for gate formation in the following steps.

In FIG. 3E, the substrate is etched isotropically to round out the bottoms of the trenches. The trench is approximately between 0.5-2.5 µm deep and approximately between 0.2-1.5

µm wide in some embodiments; other dimensions can also be used. To provide a smooth surface for growing gate dielectric material, a sacrificial layer of $SiO_2$ 430 is grown in the trenches. This layer is then removed by the process of wet etching. In FIG. 3G, a layer of $SiO_2$ 432 is grown thermally in the trenches as dielectric material.

In FIG. 3H, poly 440 is deposited to fill up the trenches. In this case, the poly is doped to obtain the appropriate gate resistance. In some embodiments, doping takes place as the poly layer is deposited (in situ). In some embodiments, the poly is doped after the deposition. In FIG. 3I, the poly layer on top of the $SiO_2$ is etched back to form gates such as 442. At this point, top surface 444 of the gate is still recessed relative to top surface 448 of the $SiO_2$; however, top surface 444 of the gate is higher than top layer 446 of the silicon. In some embodiments, no mask is used in poly etch back. In some embodiments, a mask is used in poly etch back to eliminate the use of an additional mask in the following body implanting process. In FIG. 3J, the $SiO_2$ hard mask is removed. In some embodiments, dry etch is used for hard mask removal. The etching process stops when the top silicon surface is encountered, leaving the poly gate extending beyond the substrate surface where source and body dopants will be implanted. In some embodiments, the gate extends beyond the substrate surface by approximately between 300 Å to 20000 Å. Other values can also be used. A $SiO_2$ hard mask is used in these embodiments since it provides the desired amount of gate extension beyond the substrate surface in a controllable fashion. A screen oxide may then be grown across the wafer.

In FIG. 3K, a photoresist layer 450 is patterned on the body surface using a body mask. The unmasked regions are implanted with body dopant. Dopant material such as boron ions is implanted by bombarding the substrate surface with the dopant material, or any other appropriate implantation methods. The photoresist is then removed and the wafer is heated to thermally diffuse the implanted body dopant via a process sometimes referred to as body drive. Body region 460 is then formed. In some embodiments, the energy used for implanting the body dopant is approximately between 30-200 Kev, the dose is approximately between 5E12-4E13 ions/$cm^2$, and the resulting body depth is approximately between 0.3-2.4 µm. Other depths can be achieved by varying factors including the implant energy and dose. In some embodiments, a mask is not used in body implantation.

In FIG. 3L, a photoresist layer 610 is patterned to allow source dopant to be implanted in region 612. In this example, arsenic ions penetrate the silicon in the unmasked areas to form $N^+$ type source. In some embodiments, the energy used for implanting the source dopant is approximately between 5-80 Kev, the dose is approximately between 1E15-1E16 ions/$cm^2$, and the resulting source depth is approximately between 0.05-0.5 µm. Further depth reduction can be achieved by varying factors such as the doping energy and dose. The photoresist is then removed and the wafer is heated to thermally diffuse the implanted source dopant via a source drive process. Other implant processes may also be used as appropriate. In FIG. 3M, a dielectric (e.g. BPSG) layer 620 is disposed on the top surface of the device after source drive, and densified if needed. An etch mask 614 is then formed.

In FIG. 3N, contact trench etch is performed to form trenches such as 622, 624 and 626. Sections of the source implant and the body implant are etched away in the appropriate areas. In FIG. 3O, punch-through prevention implants 630 and 632 are formed along the vertical walls of contact trenches 622 and 624. In some embodiments, the implants are deposited by bombarding ions at an angle onto the sidewalls of the trenches. In other embodiments, implants 630 and 632 are formed using a contact etch process, which is described in more details below. In FIG. 3P, a metal stack such as Ti+TiN+Al—Si—Cu is disposed to form a contact. A mask etch 640 separates the gate metal contact from the source-body contact. Since the trench such as 624 serve as contact openings where the metal and the semiconductor meet, sharp curvature in corner regions may lead to high electric fields and degrade device breakdown. In device 350 shown, the trenches have round and smooth shapes without sharp corners, thus avoiding low breakdowns due to high electric fields.

Figure 4:
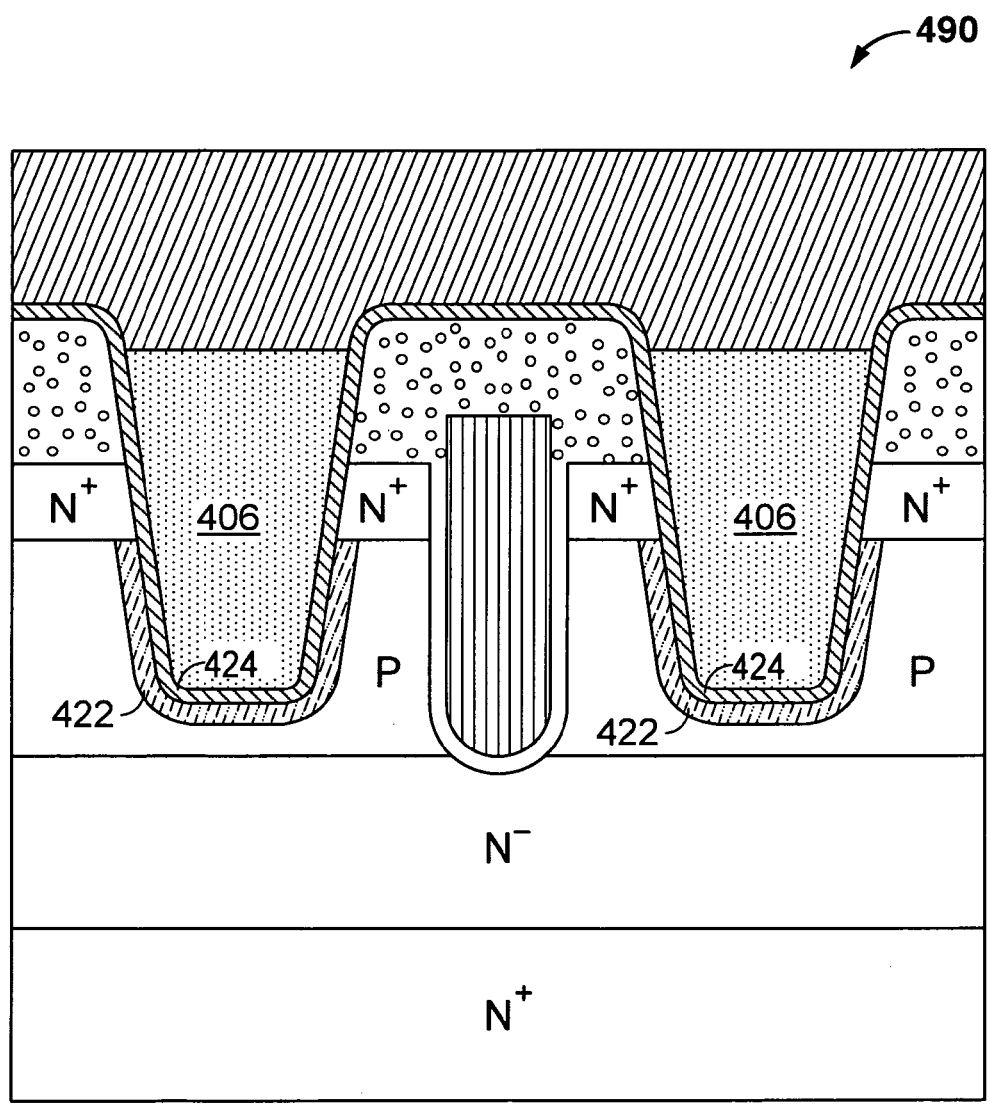
FIG. 4 is a cross sectional view of another DMOS device embodiment in which the anti-punch through implant is continuous along the trench wall and the trench bottom.

FIG. 4 is a cross sectional view of another DMOS device embodiment in which the anti-punch through implant is continuous along the trench wall and the trench bottom. In this example, a layer of $P^+$ material 422 is formed along the source-body contact trenches of device 490. In some embodiments, the $P^+$ layer is formed by bombarding the trench surface with $P^+$-type material. In some embodiments, the trench and the $P^+$ layer are formed by disposing $P^+$-type material in the body region before the trench is formed and then etching away the $P^+$-type material appropriately. A layer of contact metal 424 (such as Ti or TiN) is disposed in the trenches as well as on top of the gate oxide. The trenches are filled with material such as W. A layer of contact metal (such as Al—Si—Cu) is disposed. The depth of the trench may vary and can exceed the depth of the gate in some embodiments. Deeper trench can provide better shielding of the channel area. Although no Schottky diode is formed in this device, the device has low $R_{dson}$ and is used as a high side FET in some circuits.

Figure 5:
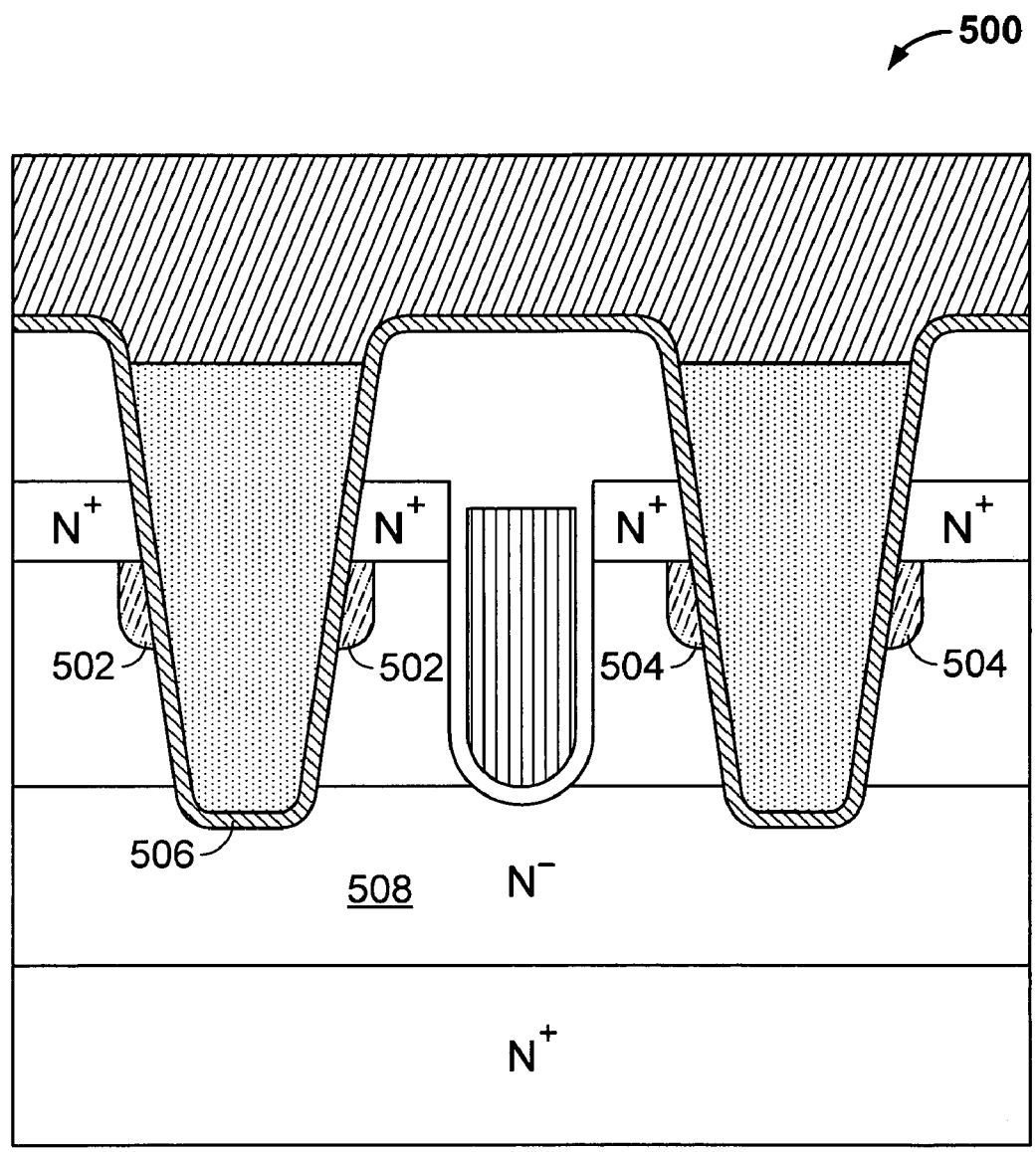
FIG. 5 is a diagram illustrating another DMOS device embodiment that includes a Schottky diode in the contact trench.

FIG. 5 is a diagram illustrating another DMOS device embodiment that includes a Schottky diode in the contact trench. In device 500 shown in this example, $P^+$-type material is disposed at an angle such that the anti-punch through implants 502 and 504 are formed along the trench walls and not in the trench bottom. Contact metal layer 506 and drain 508 form a Schottky diode with a low forward drop voltage.

Figure 6:
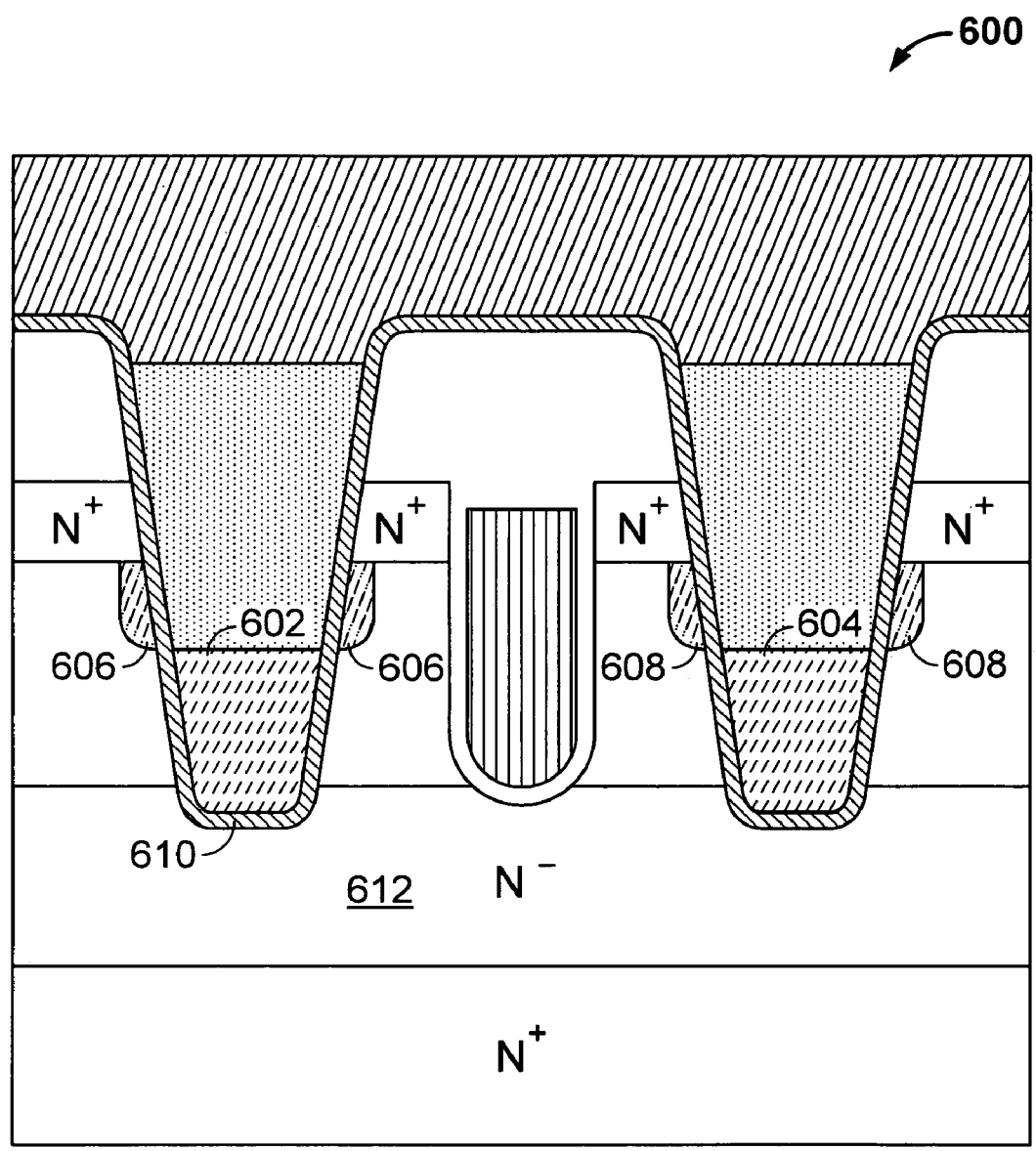
FIG. 6 is a diagram illustrating another DMOS device embodiment that includes a Schottky diode.

FIG. 6 is a diagram illustrating another DMOS device embodiment that includes a Schottky diode. In this example, plugs 602 and 604, which may be made of poly, oxide or like material, are disposed in the contact trench of device 600. Implants 606 and 608 are formed along the trench wall by bombarding the trench wall with $P^+$-type material. Plugs 602 and 604 prevent the bombarded $P^+$ ions from extending much below the top surfaces of the plugs, allowing the implants to form along the trench walls but not in the trench bottom. Schottky diodes are formed by contact electrode 610 and drain 612.

Figure 7:
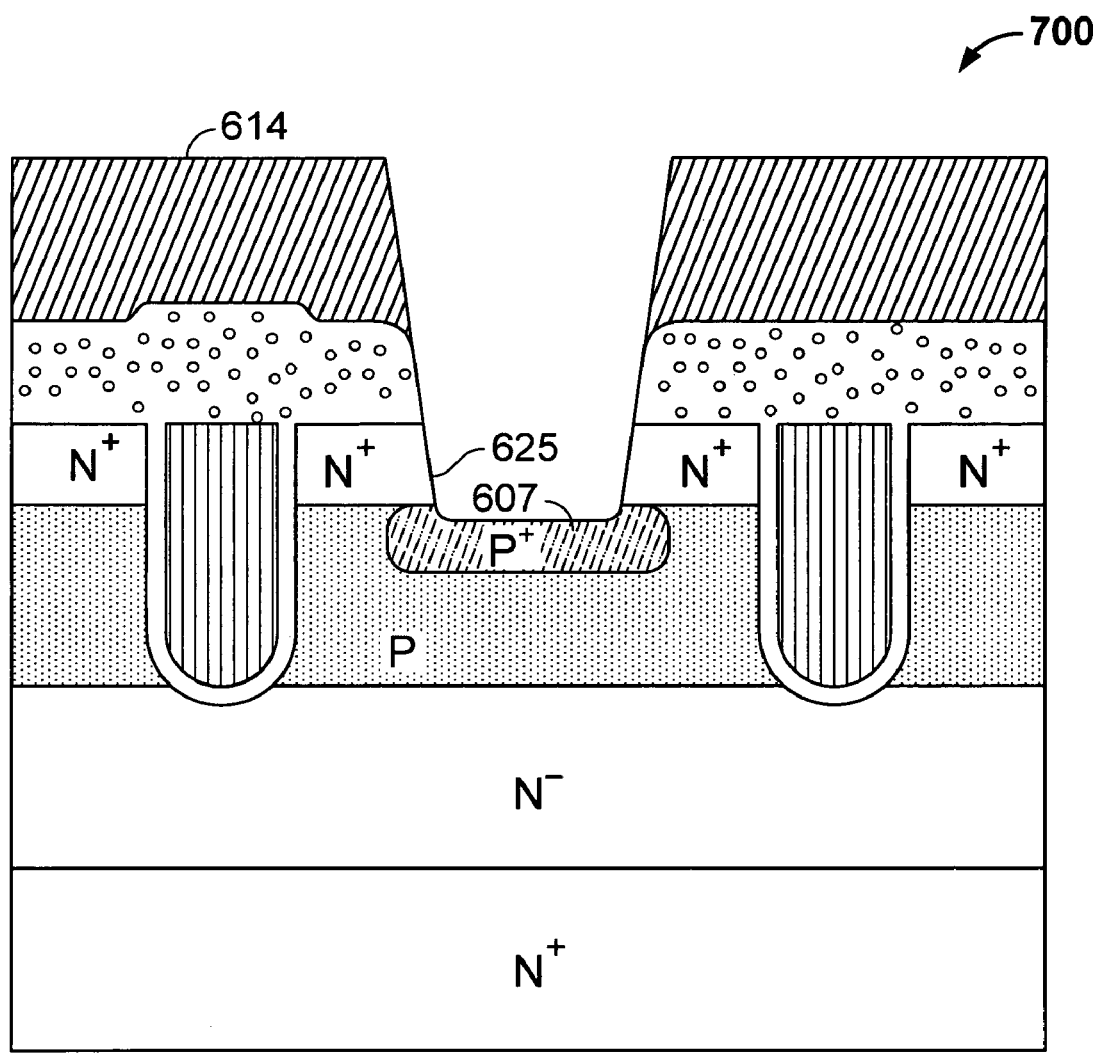
FIG. 7 is a device cross sectional view illustrating a device formed using a double contact etch process.

FIG. 7 is a device cross sectional view illustrating a device formed using a double contact etch process. In this example, contact trench etch process is performed on a structure similar to 340 of FIG. 3M to form device 700. After etch mask 614 is formed on the structure, contact trench etch is performed to form trench 625. The depth of the trench may vary for different implementations. In the example shown, the bottom of trench 625 is controlled to be substantially coplanar to the source bottom. $P^+$-type material is implanted to the bottom of the trench and then activated to form $P^+$ region 607. A second contact trench etch is performed to etch the trench through the body region to the $N^-$ drain. Metal layers are then deposited to form structures such as 350 of FIG. 3P, 500 of FIG. 5 or 600 of FIG. 6. A Shottky diode is formed between the trench metal and $N^-$ drain.

Figure 8:
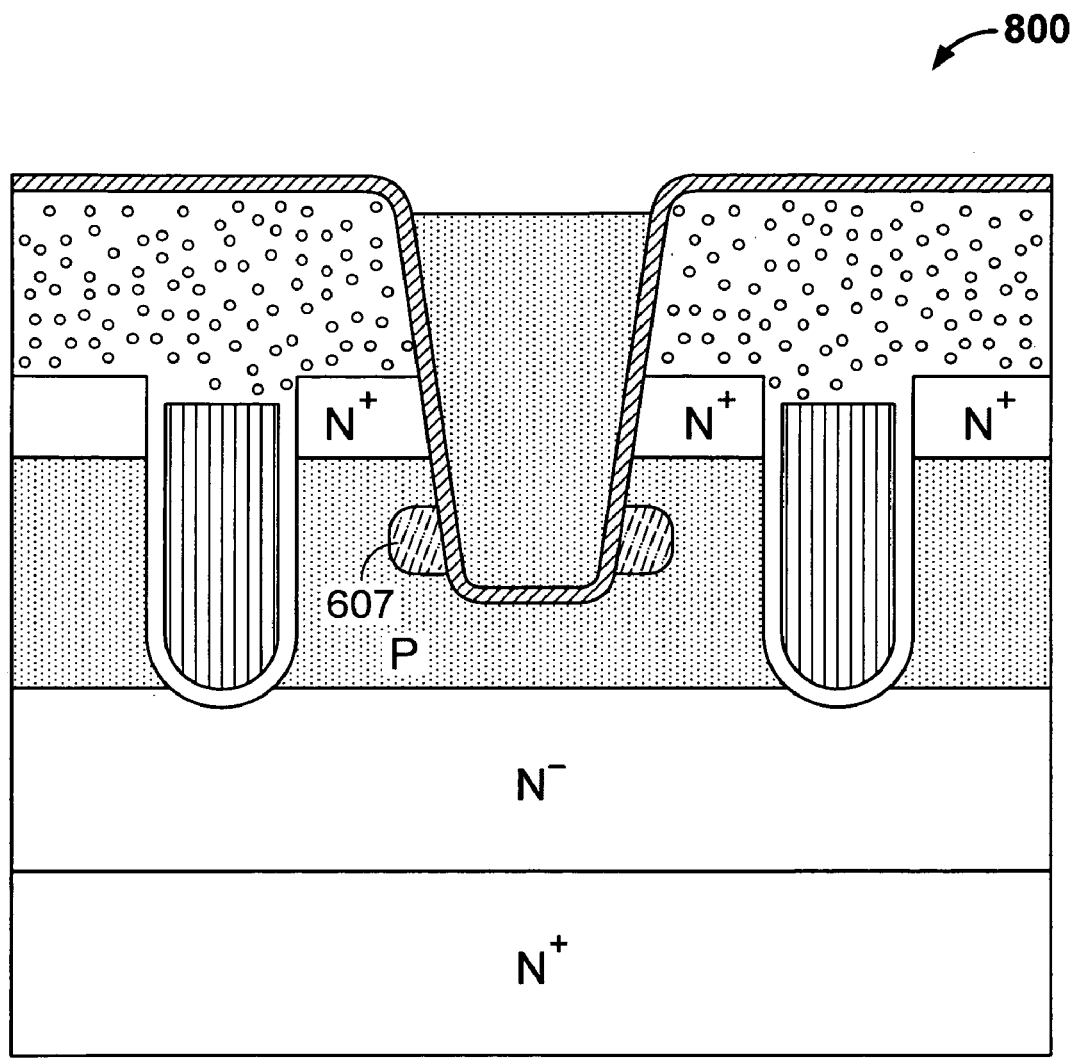
FIG. 8 is a cross sectional view of another DMOS device embodiment.

FIG. 8 is a cross sectional view of another DMOS device embodiment. In the example shown, the double contact etch technique is used to etch the trench substantially through the $P^+$ implant region 607. The residual $P^+$ implant region forms ohmic contact with metal layers deposited inside the trench. Similar to the device 490 of FIG. 4, DMOS device 800 does not include an integrated Schottky diode. The residual P+ region provides good punch through shield. Since there is no P+ region on the bottom, the device has lower injection efficiency therefore the body diode stored charge is greatly reduced.

A DMOS device and its fabrication have been disclosed. The techniques are also applicable to other semiconductor device types such as Insulated Gate Bipolar Transistors (IGBTs) and MOS-Controlled Thyristors (MCTs) where shielding the channel area using a punch through prevention implant is desirable.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A semiconductor device comprising:
   a drain;
   a body disposed over the drain;
   a source embedded in the body;
   a gate trench extending through the source and the body into the drain;
   a gate disposed in the gate trench;
   a source body contact trench extending through the source into the body;
   a conductive contact layer disposed along at least a portion of a source body contact trench sidewall and in contact with at least a portion of the source; and
   a trench filling material disposed in the source body contact trench and overlaying at least a portion of the conductive contact layer; and
   an anti-punch through dopant region that is formed in the body, along at least a portion of the source body contact trench, and in contact with the conductive contact layer; wherein
   the conductive contact layer and the drain form a Schottky diode.

2. The semiconductor device of claim 1, wherein the source body contact trench has a trench wall and a trench bottom, and the anti-punch through dopant region is disposed along the trench wall but not along at least a portion of the trench bottom.

3. The semiconductor device of claim 1, wherein the trench filling material comprising a conductive material that is different from the conductive contact layer.

4. The semiconductor device of claim 3, wherein the conductive contact layer connects to a contact metal layer disposed on top of the trench filling material, and the trench filling material extends over a top surface of the source.

5. The semiconductor device of claim 1, wherein the conductive contact layer further extends over a gate oxide layer in contact with a contact metal layer disposed on top of the trench filling material, and the trench filling material extends over a top surface of the source.

6. The semiconductor device of claim 1, wherein the source body contact trench extends through the body to the drain.

7. The semiconductor device of claim 1, wherein the source body contact trench is formed to have a smooth shape.

8. The semiconductor device of claim 1, wherein the anti-punch through dopant region includes a region heavily doped with body type dopant material.

9. A semiconductor device comprising:
   a drain;
   a body disposed over the drain;
   a source embedded in the body;
   a gate trench extending through the source and the body into the drain;
   a gate disposed in the gate trench;
   a source body contact trench extending through the source into the body;
   a conductive contact layer disposed along at least a portion of a source body contact trench sidewall and in contact with at least a portion of the source; and
   a trench filling material disposed in the source body contact trench and overlaying at least a portion of the conductive contact layer;
   an anti-punch through dopant region that is formed in the body and along a portion of the source body contact trench in contact with the conductive contact layer; and
   a plug formed in a space in a bottom region of the source body contact trench;
   wherein the anti-punch through dopant region does not extend substantially below top surface of the plug.

10. The semiconductor device of claim 9, wherein the plug comprises a conductive material contacting the conductive contact layer.

11. The semiconductor device of claim 9, wherein the conductive contact layer further connects to a contact metal layer disposed on top of the source body contact trench.

12. A semiconductor device comprising:
   a drain;
   a body disposed over the drain;
   a source embedded in the body;
   a gate trench extending through the source and the body into the drain;
   a gate disposed in the gate trench;
   a source body contact trench extending through the source into the body;
   a conductive contact layer disposed along at least a portion of a source body contact trench sidewall and in contact with at least a portion of the source; and
   a trench filling material disposed in the source body contact trench and overlaying at least a portion of the conductive contact layer; and
   a plug formed in a space in a bottom region of the source body contact trench;
   wherein the plug comprises a dielectric material overlaying a portion of the conductive contact layer.

* * * * *